United States Patent
Kong et al.

(10) Patent No.: US 6,602,801 B2
(45) Date of Patent: Aug. 5, 2003

(54) METHOD FOR FORMING A REGION OF LOW DIELECTRIC CONSTANT NANOPOROUS MATERIAL

(75) Inventors: Siew Yong Kong, Taman Berjaya (ML); Alex See, Woodlands (SG); Simon Chooi, Singapore (SG); Gautam Sarkar, Pottsfield, MA (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/012,294

(22) Filed: Nov. 13, 2001

(65) Prior Publication Data

US 2003/0092240 A1 May 15, 2003

(51) Int. Cl.$^7$ .............................................. H01L 21/469
(52) U.S. Cl. ...................... 438/778; 438/787; 438/780; 438/781; 438/782
(58) Field of Search ............................... 438/787, 778, 438/780, 781, 782

(56) References Cited

U.S. PATENT DOCUMENTS 6,093,636 A * 7/2000 Carter et al. ................ 438/623
6,107,184 A * 8/2000 Mandal et al. .............. 438/623
6,187,248 B1 * 2/2001 O'Neill et al. .............. 264/425
6,214,746 B1 * 4/2001 Leung et al. ................ 438/780
6,399,666 B1 * 6/2002 Hawker et al. ............... 521/77

FOREIGN PATENT DOCUMENTS

EP 1002830 A2 * 2/2000
EP 1150346 A2 * 10/2001

* cited by examiner

Primary Examiner—Trung Dang
(74) Attorney, Agent, or Firm—Wagner, Murabito & Hao LLP

(57) ABSTRACT

A method for forming a region of low dielectric constant nanoporous material is disclosed. In one embodiment, the present method includes the step of combining a plurality of materials to form a solution. In the present embodiment, the plurality of materials comprising a low dielectric constant material, a pore generator material, and a solvent. In this embodiment, the present method then applies the solution to a surface above which it is desired to form the region of low dielectric constant nanoporous material. Next, the present embodiment subjects the solution, which has been applied to the surface, to a thermal process such that a region of low dielectric constant nanoporous material is formed above the surface.

35 Claims, 5 Drawing Sheets

METHOD FOR FORMING A REGION OF LOW DIELECTRIC CONSTANT NANOPOROUS MATERIAL

FIELD OF THE INVENTION

The present claimed invention relates to the field of semiconductor processing. More particularly, the present claimed invention relates to a method for forming a nanoporous material suited for use as an intermetal dielectric (IMD) and/or interlayer dielectric (ILD) material.

BACKGROUND ART

As semiconductor geometries continue to become smaller and smaller, new difficulties arise in the fabrication of semiconductor devices. As one example, with progressively finer design rules, a problem has arisen due to capacitance between adjacent metal layers (i.e. interlayer capacitance). That is, as devices shrink in size, adjacent layers are spaced more closely together. Such a condition results in a deleterious increase in interlayer capacitance which adversely affects operation of finer design rule-based semiconductor devices. A similar problem exists due to the reduced distance between adjacent metal lines. Specifically, under some circumstances, unwanted effects such as cross-talk and various other RC (resistance/capacitance) effects between closely spaced metal lines negatively affect the operation of the semiconductor devices.

It is well known that the dielectric constant for a conventional interlayer dielectric material such as, for example, CVD-deposited silicon dioxide is around 3.9. However, according to the SIA (Semiconductor Industry Association) roadmap, by the year 2005 ultra-low dielectric constant materials (i.e. materials with a dielectric constant of 2.0 or less) will be required for use in 100 nanometer generation integrated circuits. Therefore, it is increasingly important to reduce the dielectric constant of an interlayer and/or intermetal insulating material.

It is generally agreed that only porous materials can achieve the desired reduced dielectric constants (i.e. dielectric constant of less than 2.0). One conventional method for creating a porous dielectric material is to positively form voids within the material. In one prior art approach, small particles within the dielectric are subjected to an etching process. However, such a prior art approach is not particularly cost effective, is not time effective, and does not readily produce desired results.

Furthermore, in order to achieve widespread acceptance, and to ensure affordability, any method of forming a low dielectric constant nanoporous material, which overcomes the above-listed drawbacks, should be compatible with existing semiconductor fabrication processes.

Thus, a need exists for a method for forming a nanoporous material for reducing interlayer capacitance and reducing RC effects between neighboring metal lines. Yet another need exists for a method for forming a nanoporous material which meets the above need and which does not require etching of small particles. Still another need exists for a method for forming a nanoporous material wherein the method meets all of the above-listed needs and wherein the method is compatible with existing semiconductor fabrication processes.

SUMMARY OF INVENTION

The present invention provides a method for forming a nanoporous material for reducing interlayer capacitance and reducing RC effects between neighboring metal lines. The present invention further provides a method for forming a nanoporous material which achieves the above accomplishment and which does not require etching of small particles. The present invention further provides a method for forming a nanoporous material wherein the method achieves the above-listed accomplishments and wherein the method is compatible with existing semiconductor fabrication processes.

In one embodiment of the present invention, the present method comprises the step of combining a plurality of materials to form a solution. In the present embodiment, the plurality of materials comprising a low dielectric constant material, a pore generator material, and a solvent. In this embodiment, the present method then applies the solution to a surface above which it is desired to form the region of low dielectric constant nanoporous material. Next, the present embodiment subjects the solution, which has been applied to the surface, to a thermal process such that a region of low dielectric constant nanoporous material is formed above the surface.

In another embodiment, the present invention includes the steps of the above-described embodiment, and further includes the step of subjecting the solution, after application to the surface, to a thermal process. In this embodiment, the thermal process includes a baking stage, a first thermal treatment stage, and a second thermal treatment stage. In the present embodiment, the baking stage is performed to drive out the solvent. Also, the first thermal treatment stage is performed to induce curing of the low dielectric constant material. Furthermore, the second thermal treatment stage is performed to induce decomposition of the pore generator material such that nanopores are formed within the low dielectric constant material.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention.

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
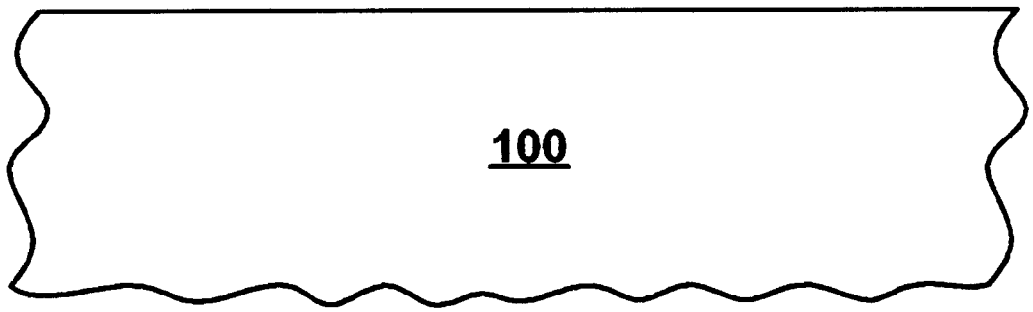
FIG. 1A is a side sectional view of the structure above which a region of nanoporous dielectric material will be formed in accordance with one embodiment of the present claimed invention.
Figure 1B:
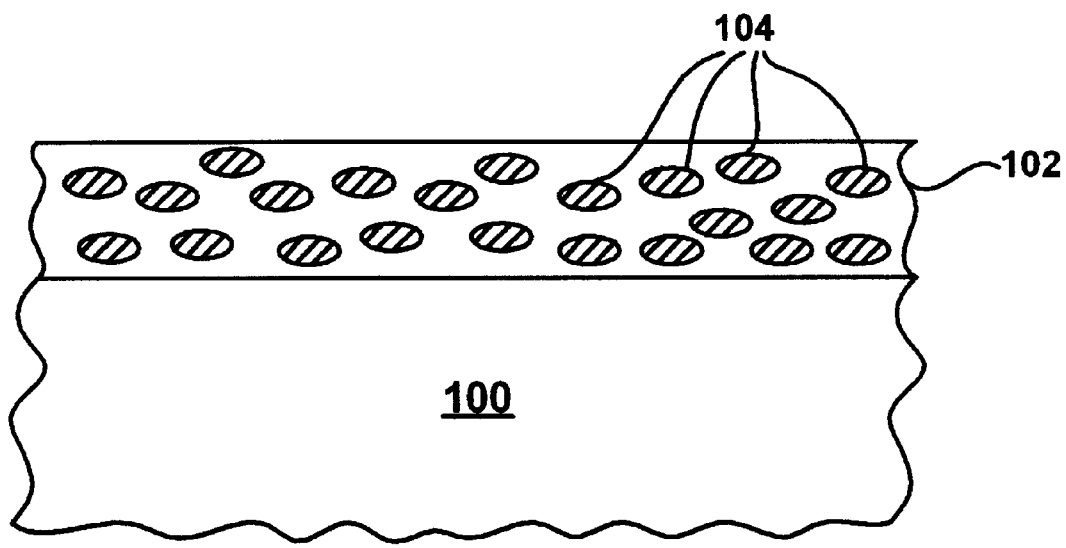
FIG. 1B is a side sectional view of the structure of FIG. 1A having a solution deposited thereabove in accordance with one embodiment of the present claimed invention.
Figure 1C:
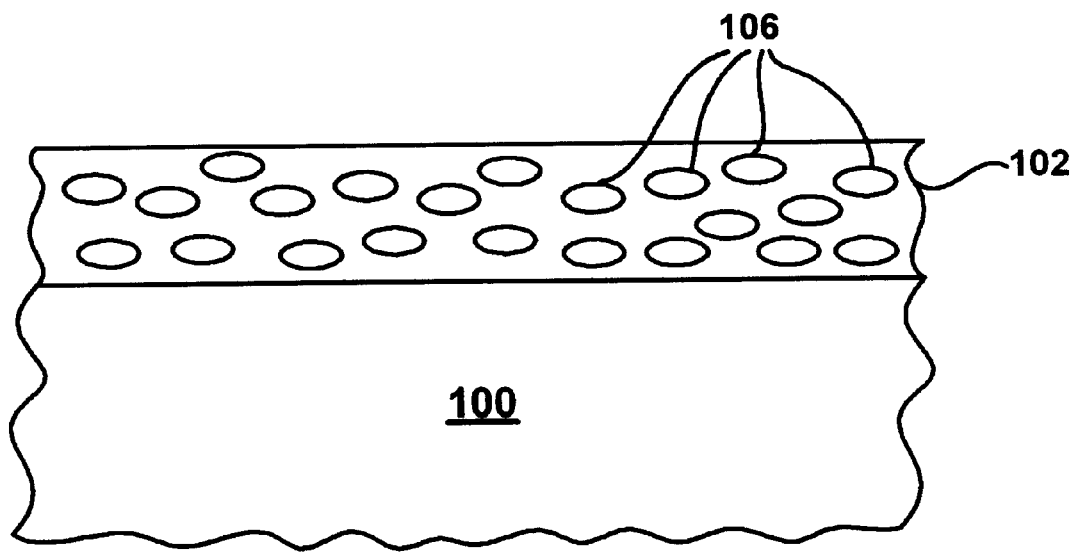
FIG. 1C is a side sectional view of the structure of FIG. 1B after the solution has been subjected to a thermal process in accordance with one embodiment of the present claimed invention.
Figure 2:
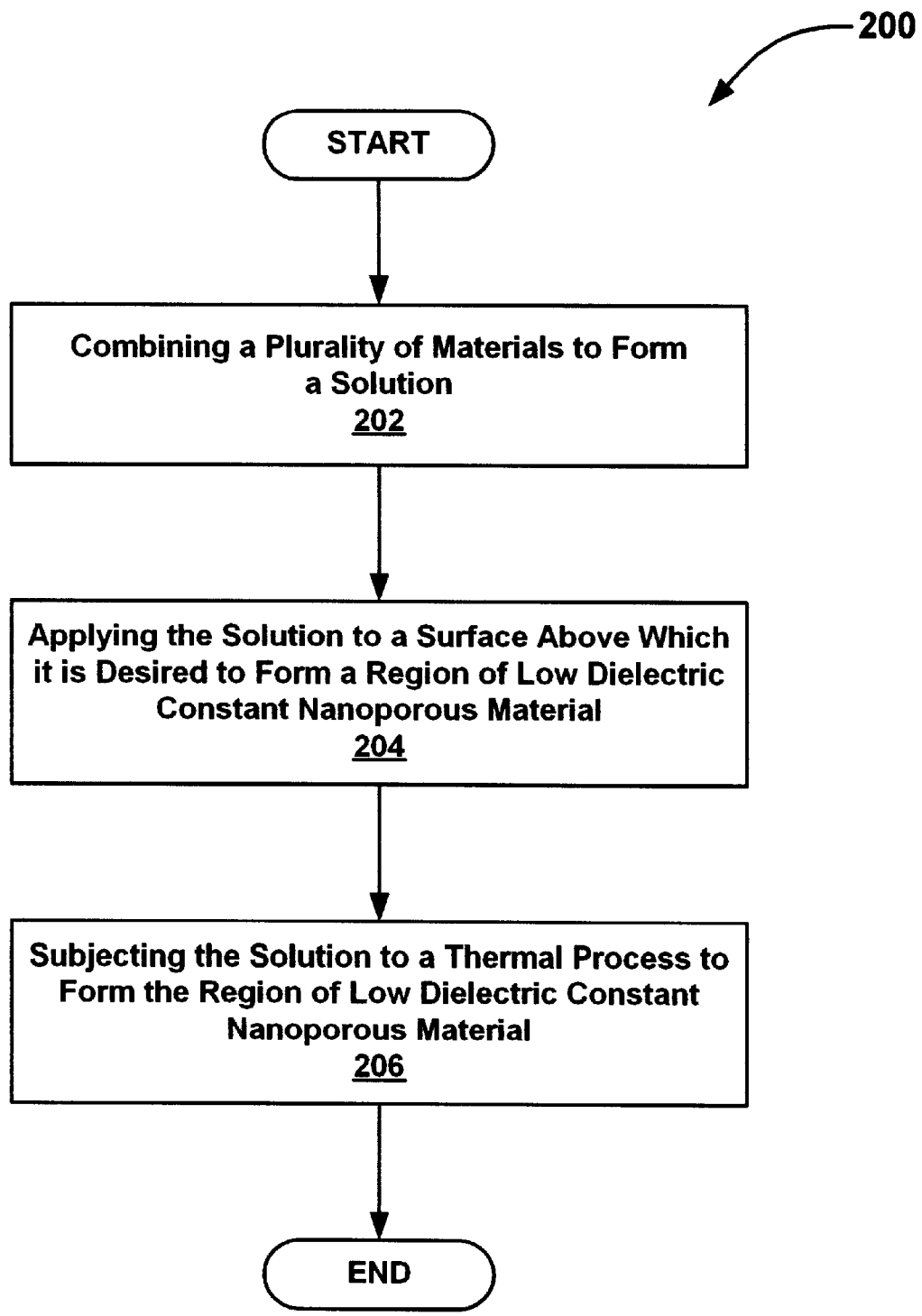
FIG. 2 is a flow chart of steps performed in accordance with one embodiment of the present claimed invention.
Figure 3:
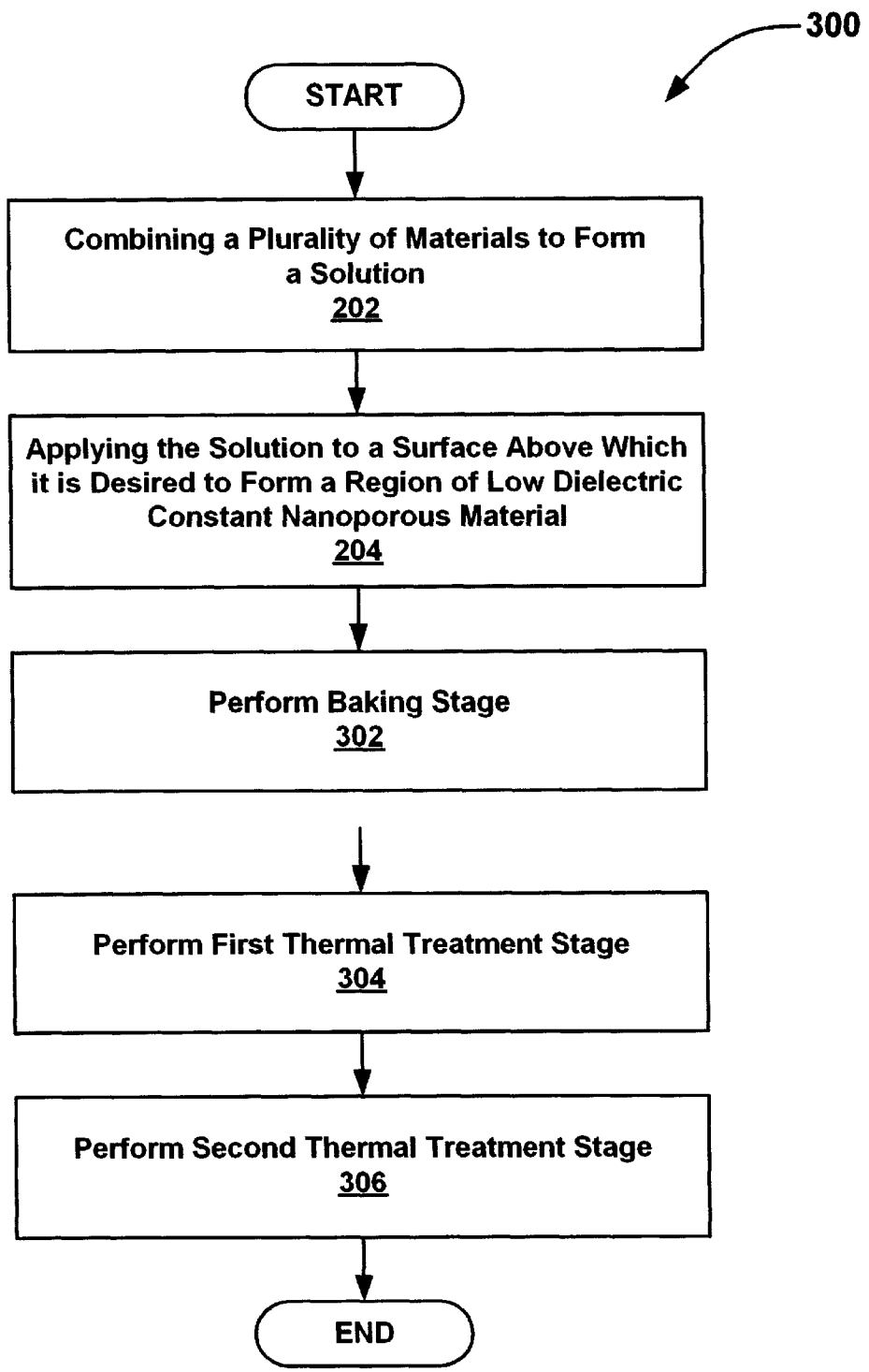
FIG. 3 is a flow chart of steps performed in accordance with another embodiment of the present claimed invention.

FIGS. 1A–1C provide side sectional views of an exemplary structure created according to embodiments of the method of the present invention as set forth in the flow charts of FIGS. 2 and 3. For purposes of clarity, the following discussion will utilize the side sectional views of FIGS. 1A–1C in conjunction with the flow chart of FIGS. 2 and 3 to clearly describe the embodiments of the present invention. FIG. 1A shows a surface 100 above which it is desired to form a region of low dielectric constant nanoporous material. Surface 100 is, for example, a first patterned metal layer containing metal lines which will benefit from having a low dielectric constant nanoporous material disposed therebetween. Surface 100 is also well suited to being, for example, a first, second or higher, patterned metal layer which will subsequently have another metal layer formed thereabove. In such an instance, the low dielectric constant nanoporous material of the present invention will function superbly as an intermetal dielectric (IMD) material. Surface 100 is also well suited to being, for example, a semiconductor substrate into which active devices have been formed (i.e. prior to the deposition and patterning of the first metal layer). In such an instance, the low dielectric constant nanoporous material of the present invention will function superbly as an interlayer dielectric (ILD) material.

Referring now to flow chart 200 of FIG. 2, the present embodiment begins with step 202. At step 202, the method of the present embodiment comprises combining a plurality of materials to form a solution. In one embodiment, the plurality of materials include: a low dielectric constant material (also referred to as a matrix material); a pore generator material; and a solvent. Although not specifically recited in this embodiment, in another embodiment of the present invention, the plurality of materials further include a surfactant. That is, the present invention is well suited both to an embodiment which does not include a surfactant, and to an embodiment which does include a surfactant.

With reference still to step 202 of FIG. 2, in one embodiment of the present invention, the low dielectric constant material/matrix material is the material that forms the bulk of the low dielectric constant nanoporous material, and is preferably a low-k material. In one embodiment, the low dielectric constant material/matrix material comprises approximately 10–50 percent by weight of the solution. Moreover, in one embodiment, the low dielectric constant material/matrix material is selected from silicon-based inorganic materials or hydrogen doped silicon oxide (e.g. hydrogen silsesquioxane (HSQ) and silicates), silicon-based organic materials or carbon doped silicon oxide (e.g. alkyl silsesquioxanes and aryl silsesquioxanes), and organic materials (e.g. SiLK™ from Dow Chemical Company of Midland, Mich.; Velox™ from Schumacher of Carlsbad, Calif.; and Flare™ from Honeywell, of Morristown, N.J.).

Referring still to step 202 of FIG. 2, in the solution of the present embodiment, the pore generator material comprises approximately 5–40 percent by weight of the solution. Also, in one embodiment, the pore generator material is a thermally labile low molecular weight polymer (e.g. <500,000) which decomposes under certain conditions (e.g. under 450 degrees Celsius). In one embodiment, the thermally labile low molecular weight polymer which decomposes under certain conditions is selected from the group consisting of poly methyl methacrylate (PMMA), polybutadiene, polypropyl oxide, polynorbornylene, and dendrimers (e.g. Starburst™ Dendrimer). Furthermore, the present invention is well suited to an embodiment in which multiple pore generator materials are used.

With reference again to step 202 of FIG. 2, in the solution of the present embodiment, the solvent comprises approximately 40–80 percent by weight of the solution. The solvent is used as the material into which the low dielectric constant material (i.e. the matrix material) and the pore generator material are dissolved. As a result, the solvent should be selected such that it is compatible with both the low dielectric constant material/matrix and the pore generator material. Additionally, in one embodiment, the solvent is comprised of a methyl isobutyl ketone (MIBK). Furthermore, the present invention is well suited to an embodiment in which multiple solvents are used.

Referring yet again to step 202 of FIG. 2, as mentioned above, in one embodiment, the plurality of materials combined to form the solution includes a surfactant. In one such embodiment, the surfactant comprises more than zero percent but less than approximately one percent by weight of the solution. The surfactant is used in such an embodiment to, for example, help disperse the pore generator material. Furthermore, in one such embodiment, the surfactant is typically a nonionic, cationic or anionic surfactant. In one specific embodiment of the present invention, the solution is comprised of a mixture of hydrogen silsesquioxane (HSQ), polybutadiene (PB), and methyl isobutyl ketone (MIBK). Additionally, in this embodiment, a FOX® solution (15 percent volume by weight of HSQ in methyl isobutyl ketone) was mixed with polybutadiene to obtain a clear solution. The weight percentage of polybutadiene can be varied, in this embodiment, to control the volume fraction of porosity in the resulting films. In this embodiment, the solution ultimately produces a nanoporous dielectric film via hybrid templating technique using standard spin-coating and curing process. Such spin coating and curing processes are described below in detail.

With reference now to step 204, the present method recites applying the solution prepared at step 202 above the surface of FIG. 1A. That is, at step 204, the present embodiment applies the solution prepared at step 202 to a surface above which it is desired to form a region of low dielectric constant nanoporous material. FIG. 1B shows a side sectional view of the structure of FIG. 1A after the solution 102 prepared in accordance with step 202 of FIG. 2 has been applied thereabove. In one embodiment, solution 102 prepared at step 204, is applied above the surface of substrate 100 so as to provide a low dielectric constant nanoporous material between metal lines (not shown) of a first patterned metal layer disposed, for example, on the top surface of substrate 100. Hence, in the present embodiment, a method is provided for forming a nanoporous material, after subsequent treatment, which reduces RC effects between neighboring metal lines. Thus, in such an embodiment, the low dielectric constant nanoporous material of the present invention functions superbly as an interlayer dielectric (ILD) material.

Referring still to FIG. 1B and to step 204 of FIG. 2, in another embodiment, solution 102 prepared at step 204, is applied above the surface of substrate 100 so as to provide a low dielectric constant nanoporous material between adjacent metal layers (not shown) sequentially formed above the top surface of substrate 100. Hence, in such an embodiment, a method is provided for forming a nanoporous material, after subsequent treatment, which reduces interlayer capacitance. That is, the low dielectric constant nanoporous material of the present invention functions superbly as an intermetal dielectric (IMD) material. Although such specific implementations of the present method are recited above, the present invention is well suited to employing the present method to form a region of low dielectric constant nanoporous material for various other applications and purposes.

Referring again to FIG. 1B, the pore generator material is typically shown as areas 104, in FIG. 1B. Areas 104 typically have a nanometer-level size. As mentioned above, the pore generator material is a thermally labile low molecular weight polymer (e.g. poly methyl methacrylate (PMMA), polybutadiene, polypropyl oxide, polynorbornylene, and dendrimers (e.g. Starburst™ Dendrimer)) which decomposes under certain conditions. As will be described below in conjunction with the discussion of FIG. 1C and step 206 of FIG. 2, the pore generator material 104 is eventually removed/decomposed by a thermal process to leave pores in the matrix material of solution 102.

With reference still to FIG. 1B, and to step 204, in one embodiment of the present invention, step 204 comprises applying solution 102 to the surface above which it is desired to form the region of low dielectric constant nanoporous material using a spin-on-process. In one such embodiment, solution 102 is applied with a uniform thickness above the surface of substrate 100 using such a spin-on-process. Furthermore, in still another embodiment, solution 102 is applied with a uniform thickness of approximately one micron above the surface of substrate 100 using such a spin-on-process. In yet another embodiment, step 204 comprises applying solution 102 to the surface above which it is desired to form the region of low dielectric constant nanoporous material using a spin-on-process which employs a spin speed of approximately 1000 to 4000 revolutions per minute. Although such specific solution application implementations of the present method are recited above, the present invention is well suited to applying solution 102 using various other application processes.

With reference now to FIG. 1C, and to step 206 of FIG. 2, the present embodiment then subjects solution 102 which has been applied to the surface of substrate 100, to a thermal process. In so doing, solution 102 is formed into a region of low dielectric constant nanoporous material above the surface of substrate 100. The thermal process of step 206 drives out solvent present in solution 102, causes curing of some components of solution 102, and removes/decomposes pore generator material in areas 104 such that pores 106 are formed as shown in FIG. 1C. That is, the formation of pores 106 involves the generation of low molecular weight by-products as a result of decomposition of the pore generator material. During the thermal process, these low molecular weight by-products diffuse out of the film which comprises the rest of the region of low dielectric constant nanoporous material (now shown as 102). As a result, a cured region of low dielectric constant nanoporous material 102 is formed above substrate 100. The size of pores 106 and film morphology of are dictated by the initial morphology of the pore generator before the thermal treatment of step 206. Additionally, the thermal treatment applied will also influence the morphology of the resultant porous film comprising the region of low dielectric constant nanoporous material.

With reference still to FIG. 1C and to step 206 of FIG. 2, the method of the present embodiment advantageously forms a nanoporous material without requiring the tedious etching of small particles associated with conventional processes. Additionally, the method of the present embodiment achieves its accomplishments without requiring substantial revamping/retooling of existing semiconductor fabrication processes and equipment.

With reference now to FIG. 3, a flow chart 300 of steps performed in accordance with another embodiment of the present invention is shown. As shown in flow chart 300, the method of the present embodiment includes the steps and features of the above-described embodiment (i.e. as recited in steps 202–206, and shown in FIGS. 1A–1C) with the exception that the thermal process of step 206 is replaced by steps 302, 304, and 306. For purposes of brevity and clarity, a discussion of steps 202 and 204 is not repeated here. Steps 302, 304, and 306 are described below in detail.

At step 302, the thermal process of this embodiment performs a baking stage performed to drive out solvent present in solution 102. In one embodiment, the baking stage of the thermal process comprises subjecting solution 102 to a temperature in the range of approximately 50 degrees Celsius to 300 degrees Celsius to drive out the solvent.

At step 304, the thermal process of this embodiment then performs a first thermal treatment stage to induce curing of the low dielectric constant material (e.g. the matrix portion) of solution 102. In one embodiment, the first thermal treatment stage comprises ramping solution 102, which has been applied to the surface of substrate 100, to a temperature of approximately 400 degrees Celsius in an inert ambient (e.g. nitrogen) for approximately 30 minutes.

At step 306, the thermal process of this embodiment then performs a second thermal treatment stage to induce decomposition of the pore generator material such that nanopores are formed within the low dielectric constant material (i.e. the matrix material) of solution 102. In one embodiment, the second thermal treatment stage comprises ramping solution 102, which has been applied to the surface of substrate 100, to a temperature of approximately 450 degrees Celsius in an inert ambient (e.g. nitrogen) for approximately 30 minutes.

In another embodiment of the present invention, the two-stage thermal process is performed as follows. First, solution 102, which has been applied to the surface of substrate 100, is ramped from a lower temperature to a temperature of approximately 400 degrees Celsius in an inert ambient (e.g. nitrogen) and is maintained at a temperature of approximately 400 degrees Celsius for approximately 30 minutes. Next, in the present embodiment, substrate 100, and its overlying features, remain within the same piece of equipment (i.e. the wafer is not transferred to another piece of equipment) and are ramped from a temperature of approximately 400 degrees Celsius to a temperature of approximately 450 degrees Celsius. In this embodiment, substrate 100, and its overlying features are maintained at a temperature of approximately 450 degrees Celsius for approximately 30 minutes. Finally, the present embodiment then cools substrate 100, and its overlying features to a lower temperature (not necessarily as low as room temperature).

With reference still to FIG. 1C and to steps 302, 304, and 306 of FIG. 3, the method of the present embodiment advantageously forms a nanoporous material without requiring the tedious etching of small particles associated with conventional processes. Additionally, the method of the present embodiment achieves its accomplishments without requiring substantial revamping/retooling of existing semiconductor fabrication processes and equipment.

Although such specific thermal process steps of the present method are recited above, the present invention is well suited to subjecting solution 102 to various other thermal process temperatures, exposure times, and conditions.

Thus, the present invention provides a method for forming a nanoporous material for reducing interlayer capacitance and reducing RC effects between neighboring metal lines. The present invention further provides a method for forming a nanoporous material which achieves the above accomplishment and which does not require etching of small particles. The present invention further provides a method for forming a nanoporous material wherein the method achieves the above-listed accomplishments and wherein the method is compatible with existing semiconductor fabrication processes.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A method for forming a region of low dielectric constant nanoporous material, said method comprising the steps of:
   a) combining a plurality of materials to form a solution, said plurality of materials comprising a low dielectric constant material, a pore generator material, and a solvent;
   b) applying said solution to a surface above which it is desired to form said region of low dielectric constant nanoporous material; and
   c) subjecting said solution, which has been applied to said surface, to a thermal process such that said region of low dielectric constant nanoporous material is formed above said surface, wherein said plurality of materials further comprise a surfactant.

2. The method for forming a region of low dielectric constant nanoporous material as recited in step a) of claim 1 wherein said surfactant is selected from the group consisting of anionic, cationic, and nonionic surfactants.

3. The method for forming a region of low dielectric constant nanoporous material as recited in step a) of claim 1 wherein said low dielectric constant material is comprised of inorganic material.

4. The method for forming a region of low dielectric constant nanoporous material as recited in step a) of claim 3 wherein said inorganic material is a silicon-based inorganic material.

5. The method for forming a region of low dielectric constant nanoporous material as recited in step a) of claim 1 wherein said low dielectric constant material is comprised of organic material.

6. The method for forming a region of low dielectric constant nanoporous material as recited in step a) of claim 5 wherein said organic material is a silicon-based organic material.

7. The method for forming a region of low dielectric constant nanoporous material as recited in step a) of claim 1 wherein said pore generator material is comprised of a thermally labile low molecular weight polymer which decomposes under certain conditions.

8. The method for forming a region of low dielectric constant nanoporous material as recited in step a) of claim 7 wherein said thermally labile low molecular weight polymer which decomposes under certain conditions is selected from the group consisting of poly methyl methacrylate (PMMA), polybutadiene, polypropyl oxide, polynorbornylene, and dendrimers.

9. The method for forming a region of low dielectric constant nanoporous material as recited in step a) of claim 1 wherein said solvent is comprised of a methyl isobutyl ketone (MIBK).

10. The method for forming a region of low dielectric constant nanoporous material as recited in claim 1 wherein step b) comprises applying said solution, using a spin-on-process, to said surface above which it is desired to form said region of low dielectric constant nanoporous material.

11. The method for forming a region of low dielectric constant nanoporous material as recited in claim 1 wherein step b) comprises applying said solution to said surface above which it is desired to form said region of low dielectric constant nanoporous material with a uniform thickness, using a spin-on-process.

12. The method for forming a region of low dielectric constant nanoporous material as recited in claim 1 wherein step b) comprises applying said solution to said surface above which it is desired to form said region of low dielectric constant nanoporous material with a uniform thickness of approximately one micron, using a spin-on-process.

13. The method for forming a region of low dielectric constant nanoporous material as recited in claim 10 wherein said spin-on-process employs a spin speed of approximately 1000 to 4000 revolutions per minute.

14. The method for forming a region of low dielectric constant nanoporous material as recited in claim 1 wherein said thermal process of step c) comprises subjecting said solution, which has been applied to said surface, to a baking stage to drive out said solvent.

15. The method for forming a region of low dielectric constant nanoporous material as recited in step c) of claim 14 wherein said baking stage is performed at a temperature of approximately 50 degrees Celsius to 300 degree Celsius.

16. The method for forming a region of low dielectric constant nanoporous material as recited in claim 1 wherein said thermal process of step c) comprises subjecting said solution, which has been applied to said surface, to a first thermal treatment stage and to a second thermal treatment stage.

17. The method for forming a region of low dielectric constant nanoporous material as recited in step c) of claim 16 wherein said first thermal treatment stage is performed to induce curing of said low dielectric constant material.

18. The method for forming a region of low dielectric constant nanoporous material as recited in step c) of claim 15 wherein said second thermal treatment stage is performed to induce decomposition of said pore generator material such that nanopores are formed within said low dielectric constant material.

19. The method for forming a region of low dielectric constant nanoporous material as recited in step c) of claim 16 wherein said first thermal treatment stage comprises ramping said solution, which has been applied to said surface, to a temperature of approximately 400 degrees Celsius in an inert ambient for approximately 30 minutes.

20. The method for forming a region of low dielectric constant nanoporous material as recited in step c) of claim 16 wherein said second thermal treatment stage comprises ramping said solution, which has been applied to said surface, to a temperature of approximately 450 degrees Celsius in an inert ambient for approximately 30 minutes.

21. A method for forming a region of low dielectric constant nanoporous material, said method comprising the steps of:

a) combining a plurality of materials to form a solution, said plurality of materials comprising a low dielectric constant material, a pore generator material, and a solvent;

b) applying said solution to a surface above which it is desired to form said region of low dielectric constant nanoporous material; and c) subjecting said solution, which has been applied to said surface, to a thermal process such that said region of low dielectric constant nanoporous material is formed above said surface, thermal process comprising:

a baking stage, said baking stage performed to drive out said solvent, a first thermal treatment stage, said first thermal treatment stage performed to induce curing of said low dielectric constant material, and a second thermal treatment stage, said second thermal treatment stage performed to induce decomposition of said pore generator material such that nanopores are formed within said low dielectric constant material wherein said plurality of materials further comprise a surfactant.

22. The method for forming a region of low dielectric constant nanoporous material as recited in step a) of claim 21 wherein said surfactant is selected from the group consisting of anionic, cationic, and nonionic surfactants.

23. The method for forming a region of low dielectric constant nanoporous material as recited in step a) of claim 21 wherein said low dielectric constant material is comprised of inorganic material.

24. The method for forming a region of low dielectric constant nanoporous material as recited in step a) of claim 23 wherein said inorganic material is a silicon-based inorganic material.

25. The method for forming a region of low dielectric constant nanoporous material as recited in step a) of claim 21 wherein said low dielectric constant material is comprised of organic material.

26. The method for forming a region of low dielectric constant nanoporous material as recited in step a) of claim 25 wherein said organic material is a silicon-based organic material.

27. The method for forming a region of low dielectric constant nanoporous material as recited in step a) of claim 21 wherein said pore generator material is comprised of a thermally labile low molecular weight polymer which decomposes under certain conditions.

28. The method for forming a region of low dielectric constant nanoporous material as recited in step a) of claim 27 wherein said thermally labile low molecular weight polymer which decomposes under certain conditions is selected from the group consisting of poly methyl methacrylate (PMMA), polybutadiene, polypropyl oxide, polynorbornylene, and dendrimers.

29. The method for forming a region of low dielectric constant nanoporous material as recited in step a) of claim 21 wherein said solvent is comprised of a methyl isobutyl ketone (MIBK).

30. The method for forming a region of low dielectric constant nanoporous material as recited in claim 21 wherein step b) comprises applying said solution, using a spin-on-process, to said surface above which it is desired to form said region of low dielectric constant nanoporous material.

31. The method for forming a region of low dielectric constant nanoporous material as recited in claim 21 wherein step b) comprises applying said solution to said surface above which it is desired to form said region of low dielectric constant nanoporous material with a uniform thickness, using a spin-on-process.

32. The method for forming a region of low dielectric constant nanoporous material as recited in claim 21 wherein step b) comprises applying said solution to said surface above which it is desired to form said region of low dielectric constant nanoporous material with a uniform thickness in the range of approximately one micron, using a spin-on-process.

33. The method for forming a region of low dielectric constant nanoporous material as recited in claim 30 wherein said spin-on-process employs a spin speed of approximately 1000 to 4000 revolutions per minute.

34. The method for forming a region of low dielectric constant nanoporous material as recited in step c) of claim 21 wherein said first thermal treatment stage comprises ramping said solution, which has been applied to said surface, to a temperature of approximately 400 degrees Celsius in an inert ambient for approximately 30 minutes.

35. The method for forming a region of low dielectric constant nanoporous material as recited in step c) of claim 21 wherein said second thermal treatment stage comprises ramping said solution, which has been applied to said surface, to a temperature of approximately 450 degrees Celsius in an inert ambient for approximately 30 minutes.

* * * * *